(12) United States Patent
Samaniego (10) Patent No.: US 11,391,643 B2
(45) Date of Patent: Jul. 19, 2022

(54) METHOD AND DEVICE FOR CALIBRATING A DIFFRACTIVE MEASURING STRUCTURE

(71) Applicant: Carl Zeiss SMT GmbH, Oberkochen (DE)

(72) Inventor: Michael Samaniego, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 47 days.

(21) Appl. No.: 16/881,241

(22) Filed: May 22, 2020

(65) Prior Publication Data
US 2020/0284689 A1 Sep. 10, 2020

Related U.S. Application Data

(63) Continuation of application No. PCT/EP2018/077577, filed on Oct. 10, 2018.

(30) Foreign Application Priority Data

Nov. 23, 2017 (DE) ...................... 10 2017 221 005.2

(51) Int. Cl.
*G01M 11/02* (2006.01)

(52) U.S. Cl.
CPC ...... *G01M 11/0207* (2013.01); *G01M 11/025* (2013.01); *G01M 11/0271* (2013.01)

(58) Field of Classification Search
CPC ........... G01M 11/0207; G01M 11/025; G01M 11/0271; G01M 11/021; G01M 11/0264; G03F 7/706; G03F 7/70316
See application file for complete search history.

(56) References Cited

U.S. PATENT DOCUMENTS 7,088,458 B1 * 8/2006 Wegmann ................. G01J 9/02
356/124
9,389,519 B2 * 7/2016 Kita ......................... G03F 7/706
(Continued)

FOREIGN PATENT DOCUMENTS

CN       101681122 A  *  3/2010  ......... G03F 7/70291
CN       112987504 A  *  6/2021  ............... G03F 7/20
(Continued)

OTHER PUBLICATIONS

Espacenet English translation of DE 10 2007 009 661 (2008).*
(Continued)

*Primary Examiner* — Mohamed K Amara
(74) *Attorney, Agent, or Firm* — Edell, Shapiro & Finnan, LLC (57) ABSTRACT

The disclosed method involves: recording, under illumination of a diffractive measurement structure via an illumination device, a plurality of diffraction images which differ from one another in terms of the region of the measurement structure that contributes to the respective diffraction image, and ascertaining transmission properties and/or reflection properties of the diffractive measurement structure based on the plurality of diffraction images, wherein the steps of recording a plurality of diffraction images and of ascertaining transmission properties and/or reflection properties of the diffractive measurement structure in a plurality of recording sequences are carried out repeatedly in a plurality of recording sequences, wherein these recording sequences differ from one another with respect to the illumination angles that are respectively set during the illumination of the diffractive measurement structure and at which the diffractive measurement structure is illuminated.

14 Claims, 8 Drawing Sheets

(56) References Cited

U.S. PATENT DOCUMENTS

| | | | |
|---|---|---|---|
| 10,502,545 B2* | 12/2019 | Wegmann | G01M 11/0264 |
| 2002/0021460 A1* | 2/2002 | Hansen | G03F 7/706 |
| | | | 359/1 |
| 2010/0314534 A1* | 12/2010 | Campion | G01D 15/00 |
| | | | 250/252.1 |
| 2011/0205514 A1 | 8/2011 | Kita | |
| 2013/0258313 A1* | 10/2013 | Orband | G01M 11/0207 |
| | | | 356/51 |
| 2014/0036245 A1* | 2/2014 | Sogard | G02B 7/32 |
| | | | 355/56 |
| 2018/0087891 A1 | 3/2018 | Wegmann et al. | |
| 2019/0212226 A1* | 7/2019 | Wegmann | G03F 7/706 |

FOREIGN PATENT DOCUMENTS

| | | |
|---|---|---|
| DE | 102006021965 A1 | 11/2007 |
| DE | 102007009661 A1 | 3/2008 |
| JP | 1999023452 A6 * 1/1999 | ............. G01N 21/27 |
| WO | WO-9951972 A2 * 10/1999 | ........... G01N 23/207 |
| WO | 2016184571 A2 11/2016 | |
| WO | WO-2021165159 A1 * 8/2021 | ......... G01B 11/2441 |

OTHER PUBLICATIONS

International Search Report, PCT/EP2018/077577, dated Feb. 25, 2019, 4 pages.

German Office Action with English translation, Application No. 10 2017 221 005, dated Nov. 5, 2018, 11 pages.

Wojdyla et al., "Ptychographic wavefront sensor for high-NA EUV inspection and exposure tools", SPIE vol. 9048, (2014), 5 pages.

Hoppe, "Diffraction in the inhomogeneous primary ray wave field. I. Principle of phase measurement of electron diffraction interferences", Acta Cryst. (1966). A25, 19 pages.

International Preliminary Report on Patentability, PCT/EP2018/077577, dated May 26, 2020, 16 pages.

* cited by examiner

METHOD AND DEVICE FOR CALIBRATING A DIFFRACTIVE MEASURING STRUCTURE

CROSS REFERENCE TO RELATED APPLICATIONS

This is a Continuation of International Application PCT/EP2018/077577, which has an international filing date of Oct. 10, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 221 005.2 filed on Nov. 23, 2017.

FIELD OF THE INVENTION

The invention relates to a method and an apparatus for calibrating a diffractive measurement structure.

BACKGROUND

Microlithography is used for production of microstructured components, for example integrated circuits or LCDs. The microlithography process is conducted in what is called a projection exposure apparatus, which comprises an illumination device and a projection lens. The image of a mask (=reticle) illuminated with the illumination device is in this case projected by the projection lens onto a substrate (e.g., a silicon wafer) coated with a light-sensitive layer (photoresist) and arranged in the image plane of the projection lens, in order to transfer the mask structure to the light-sensitive coating of the substrate.

In practice, there is a need to determine a distortion and a wavefront aberration of the projection lens as exactly as possible. Known measurement arrangements for this purpose are shown merely by way of example and schematically in FIGS. 8A-8C.

Figure 8A:
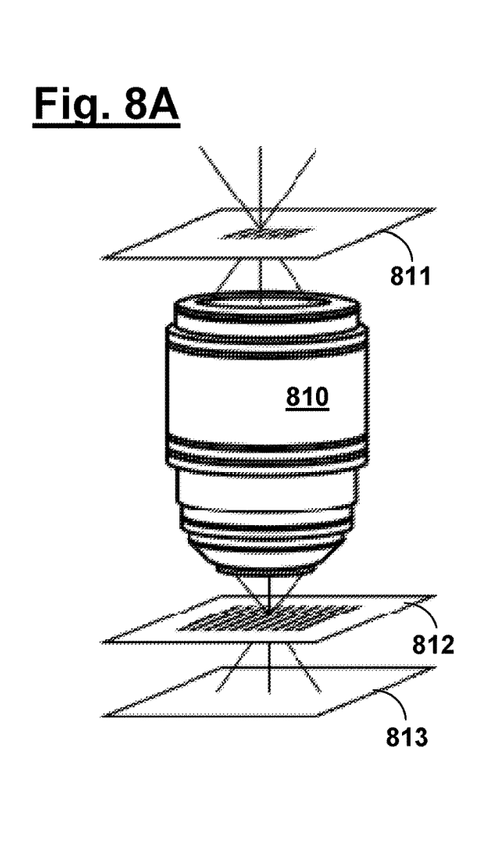
FIGS. 8A-8C show schematic representations of different measurement arrangements for explaining possible application examples of a measurement structure that is inspected according to the invention, namely an arrangement based on shearing interferometry (FIG. 8A), an arrangement based on an areal image measurement (FIG. 8B), and an arrangement using Moiré measurement technology (FIG. 8C).

FIG. 8A schematically shows a measurement setup for determining wavefront aberrations of a projection lens 810 via shearing interferometry, wherein a measurement mask 811, arranged in the object plane of the projection lens 810 to be measured, in the form of a two-dimensional shearing grating and a diffraction grating 812 arranged in the image plane of the projection lens 810 are coordinated such that, when the measurement mask 811 is imaged onto the diffraction grating 812, a superposition pattern is created in the form of an interferogram, which is detected and evaluated with a spatially resolving (for example camera-based) detector 813.

Figure 8B:
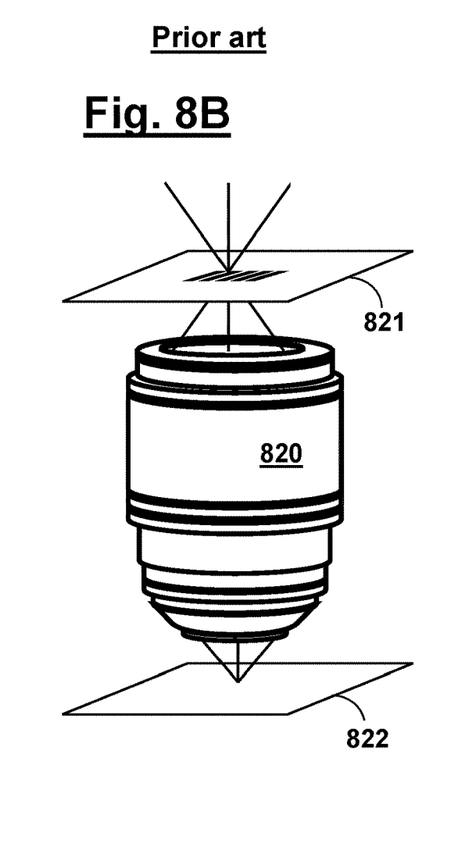

FIG. 8B schematically shows a setup for realizing an areal image measurement technique that can likewise be used to determine wavefront aberrations, wherein an object mask 821 that is located in the object plane of a projection lens 820 to be measured and has test structures is imaged via the projection lens 820 onto a (possibly defocused) image plane and recorded with a detector 822.

Figure 8C:
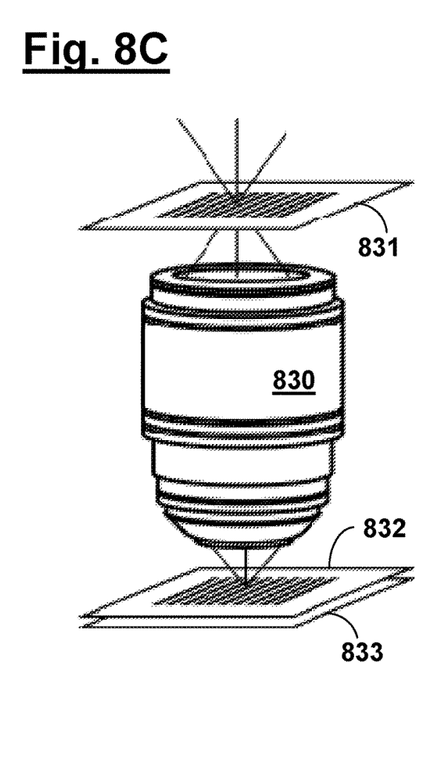

FIG. 8C shows a setup for determining the distortion using Moiré measurement technology, in which a first grating 831 arranged in the object plane of a projection lens 830 to be measured is projected onto a second grating 832 (also denoted as a "Moiré mask") arranged in the image plane of the projection lens 830 and the light intensity transmitted in each case through this arrangement is measured with a detector 833.

The measurement methods described above have in common that in each case at least one diffractive measurement structure in the form of the masks or gratings used is used.

Owing to various causes, a problem arises in practice, however, that the actual diffracting effect of such diffractive measurement structures can deviate from the respectively specified or desired effect. These causes can include, for example, manufacturing errors due to process deviations occurring in the mask manufacturing process, but also the three-dimensional topography of the mask, which, e.g. depending on the illumination direction, can result in different shading effects at the steps or edges present in the respective mask structure.

Furthermore, computer-generated holograms (CGHs) are used, for example, in the interferometric measurement of the surface of individual optical elements (in particular for the highly precise testing of the mirrors or lens elements used in the illumination device or in the projection lens). Such CGHs are phase gratings or phase masks. The calibration of the respective measurement structures is not only a demanding challenge in the case of transmission masks, but also in phase masks due to the different phase delay effect depending on the illumination direction.

Figure 7A:
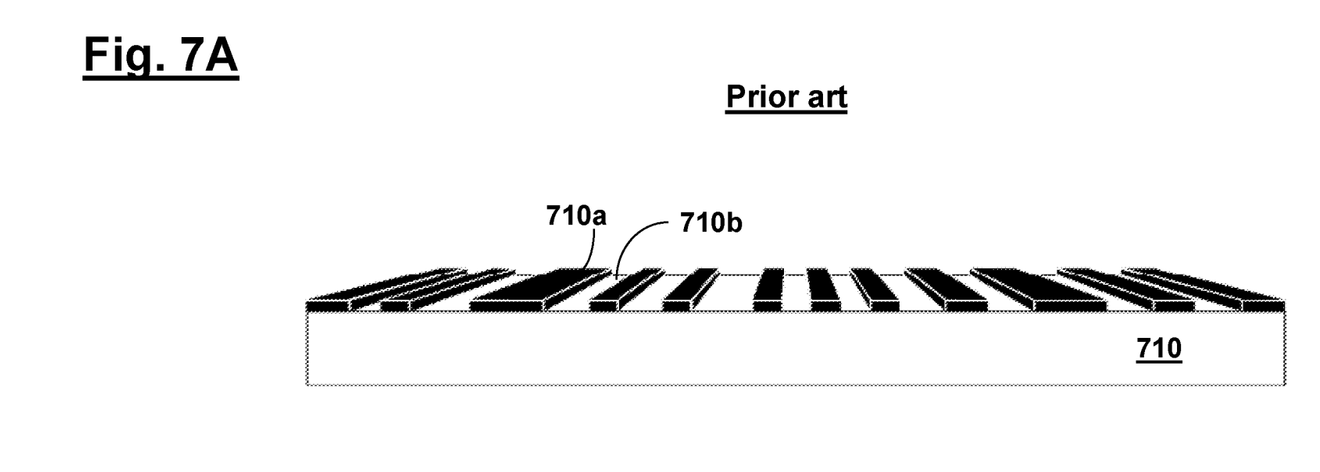
FIGS. 7A-7B show schematic representations of different mask types, specifically a transmission mask (FIG. 7A) and a phase mask (FIG. 7B)
Figure 7B:
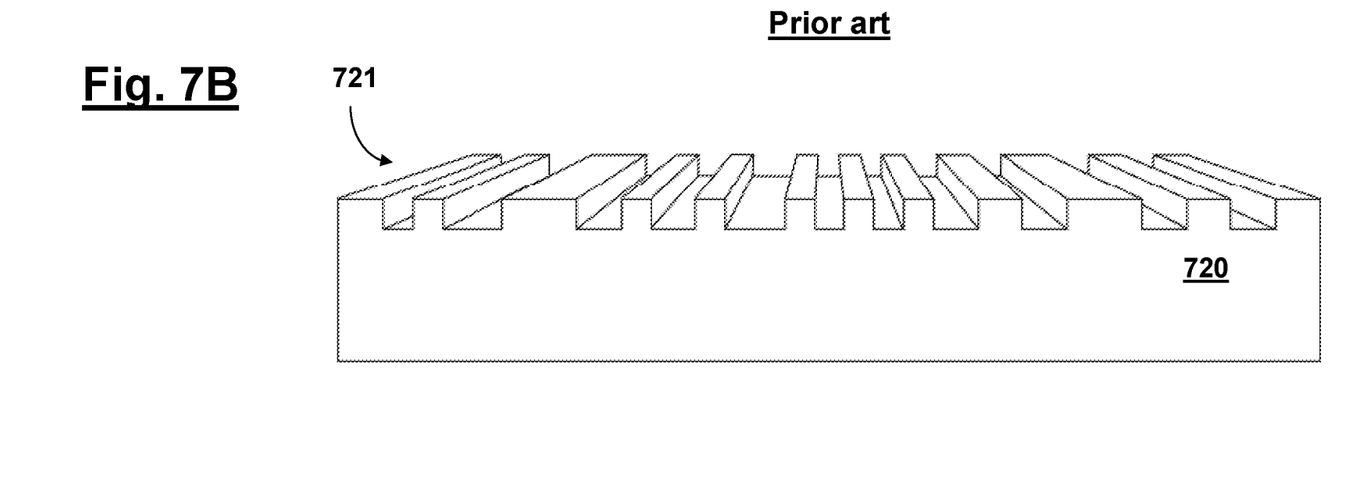

FIGS. 7A-7B serve to illustrate the abovementioned mask types. FIG. 7A merely schematically shows a transmission mask 710, which is made from materials or regions 710a, 710b with differently large absorption and thus causes a location-dependent attenuation of the light passing through. FIG. 7B likewise shows merely schematically a phase mask 720 which (with ideally locally constant transmission) causes a phase delay which varies depending on the location for light passing through due to a surface structure 721.

With respect to the prior art, reference is made merely by way of example to Hoppe, W.: "Beugung im inhomogenen Primärstrahlwellenfeld. I. Prinzip einer Phasenmessung von Elektronenbeugungsinterferenzen." Acta Crystallographica Section A. 25 (4): 495, 1969.

SUMMARY

Against the above background, it is an object of the present invention to provide a method and an apparatus for calibrating a diffractive measurement structure which, when using the respective measurement structure, in particular in measurement arrangements for measuring distortion and/or wavefront aberrations or in the highly precise testing of optical elements, makes it possible to attain greater measurement accuracies while at least partially avoiding the problems described above.

According to one formulation of the invention, the above-noted object is addressed by a method for calibrating a diffractive measurement structure, which has the following steps:

recording, under illumination of the measurement structure via an illumination device, a plurality of diffraction images which differ from one another in terms of the region of the measurement structure that contributes to the respective diffraction image; and ascertaining transmission properties and/or reflection properties of the diffractive measurement structure on the basis of said plurality of diffraction images;

wherein the steps of recording a plurality of diffraction images and of ascertaining transmission properties and/or reflection properties of the diffractive measurement structure are carried out repeatedly in a plurality of recording sequences, wherein these recording sequences differ from one another with respect to the illumination angle that is respectively set during the illumination of the diffractive measurement structure and at which the diffractive measurement structure is illuminated.

The invention involves the insight that, based on the recording of a plurality of different diffraction images of the diffractive measurement structure to be respectively inspected, it becomes possible to reconstruct the transmission properties and/or reflection properties of the measurement structure. In particular, the amplitude and phase of the electromagnetic radiation, after their interaction with the relevant diffractive structure or mask can be reconstructed in principle using reconstruction algorithms that are known per se. Based on this insight, the invention makes use, in particular, of the concept of combining this principle of recording different diffraction images with the technique of varying the illumination direction set for the illumination of the respective diffractive measurement structure or of the illumination settings used, in order thereby to determine the transmission properties (or the reflection properties, for example in the case of masks designed for use in the EUV range) of the diffractive measurement structure for different angles of incidence.

In other words, according to the invention, the diffractive measurement structure to be calibrated is inspected from different directions using tomography, with the result that, by way of the illumination-angle-dependent characterization of the transmission properties or reflection properties, a calibration is finally achieved that is realized in the process and takes into account the effects described in the introductory part of the three-dimensional topography of the respective measurement structure.

In the measurement methods described above in particular (determination of wavefront aberrations or distortion of a projection lens and high-precision surface inspection of optical elements), a significant increase in the measurement accuracy achieved in each case can thus be achieved as a result of the illumination of the respective measurement structure from different illumination directions that typically takes place in each of these applications.

According to an embodiment, the variation of the illumination angles that are set in each case during the illumination of the diffractive measurement structure comprises setting different illumination settings via the illumination device.

According to an embodiment, the illumination device has a mirror arrangement having a plurality of independently settable mirror elements.

According to an embodiment, the illumination setting is varied by selecting different mirror elements of the mirror arrangement that contribute to the illumination of the diffractive measurement structure.

According to an embodiment, the variation of the illumination angles that are respectively set during the illumination of the diffractive measurement structure comprises tilting the measurement structure.

According to an embodiment, in the step of recording a plurality of diffraction images, the region of the diffractive measurement structure that contributes to the respective diffraction image is varied using at least one stop that is displaceable in the optical beam path or by interchanging a stop located in the optical beam path for at least one stop having a different geometry.

According to an embodiment, in the step of recording a plurality of diffraction images, the region of the diffractive measurement structure that contributes to the respective diffraction image is varied such that respectively adjacent regions of the measurement structure that contribute to different diffraction images overlap one another.

According to an embodiment, the diffractive measurement structure is a phase mask, in particular a computer-generated hologram (CGH).

According to an embodiment, the diffractive measurement structure is a transmission mask for the location-dependent attenuation of incident electromagnetic radiation.

According to an embodiment, the diffractive measurement structure is a measurement structure for use in an arrangement for wavefront or distortion measurement of an optical system, in particular for microlithography, or a measurement structure for use in an arrangement for the interferometric inspection of the surface (in particular the figure or shape) of an optical element, in particular for microlithography.

According to an embodiment, a plurality of diffraction images are recorded while the diffractive measurement structure is installed in this arrangement.

According to an embodiment, transmission properties and/or reflection properties of the diffractive measurement structure are ascertained using a reconstruction algorithm in which the amplitude and phase of an electromagnetic field present downstream of the diffractive measurement structure in the direction of light propagation are reconstructed by evaluating the plurality of diffraction images.

According to an embodiment, a transfer function of the diffractive measurement structure is ascertained on the basis of the reconstruction. The interaction of a photomask with a light wave can be described by way of such a transfer function $J(x,k)$. In this case, x is the coordinate in the real space and k is the wave vector of the incident light wave (i.e. the angle of incidence). For a selection of x and k, $J(x,k)$ has the form of a complex-valued 2×2 Jones matrix that links the amplitude of the incident electromagnetic field $E_{in}$ with the amplitude of the output field $E_{out}$ and is defined for a specific wavelength $\lambda$:

$$\begin{pmatrix} E_{out,x}(x, k) \\ E_{out,y}(x, k) \end{pmatrix} = \begin{pmatrix} J_{11}(x, k) & J_{12}(x, k) \\ J_{21}(x, k) & J_{22}(x, k) \end{pmatrix} \begin{pmatrix} E_{in,x}(x, k) \\ E_{in,y}(x, k) \end{pmatrix} \quad (1)$$

According to another formulation of the invention, the above-noted object is addressed by an apparatus for calibrating a diffractive measurement structure, wherein the apparatus is designed to carry out a method having the features described above. With regard to advantages and advantageous configurations, reference is made to the explanations in association with the method according to the invention, as summarized above.

Furthermore, the invention also relates to a microlithographic projection exposure apparatus with an apparatus having the features described above.

Further configurations of the invention can be gathered from the description and the dependent claims.

The invention is explained in greater detail below on the basis of exemplary embodiments illustrated in the accompanying Figures.

DETAILED DESCRIPTION

Furthermore, different exemplary embodiments for realizing the method according to the invention or an apparatus for calibrating a diffractive measurement structure are described with reference to the schematic illustrations in FIGS. 1-6. These exemplary embodiments have in common that the principle known per se, specifically that of determining the transmission properties and/or reflection properties of said measurement structure from a multiplicity of different diffraction images of a diffractive structure using a reconstruction algorithm, is realized for different angles of incidence of the illumination radiation that is incident on the measurement structure and, as a result, the transmission properties and/or reflection properties of the diffractive measurement structure to be calibrated are obtained in an angle-resolved manner for different angles of incidence. With respect to suitable reconstruction algorithms, reference is made in this context to, for example, Hoppe, W.: "Beugung im inhomogenen Primärstrahlwellenfeld. I. Prinzip einer Phasenmessung von Elektronenbeugungsinterferenzen." Acta Crystallographica Section A. 25 (4): 495, 1969.

Figure 1:
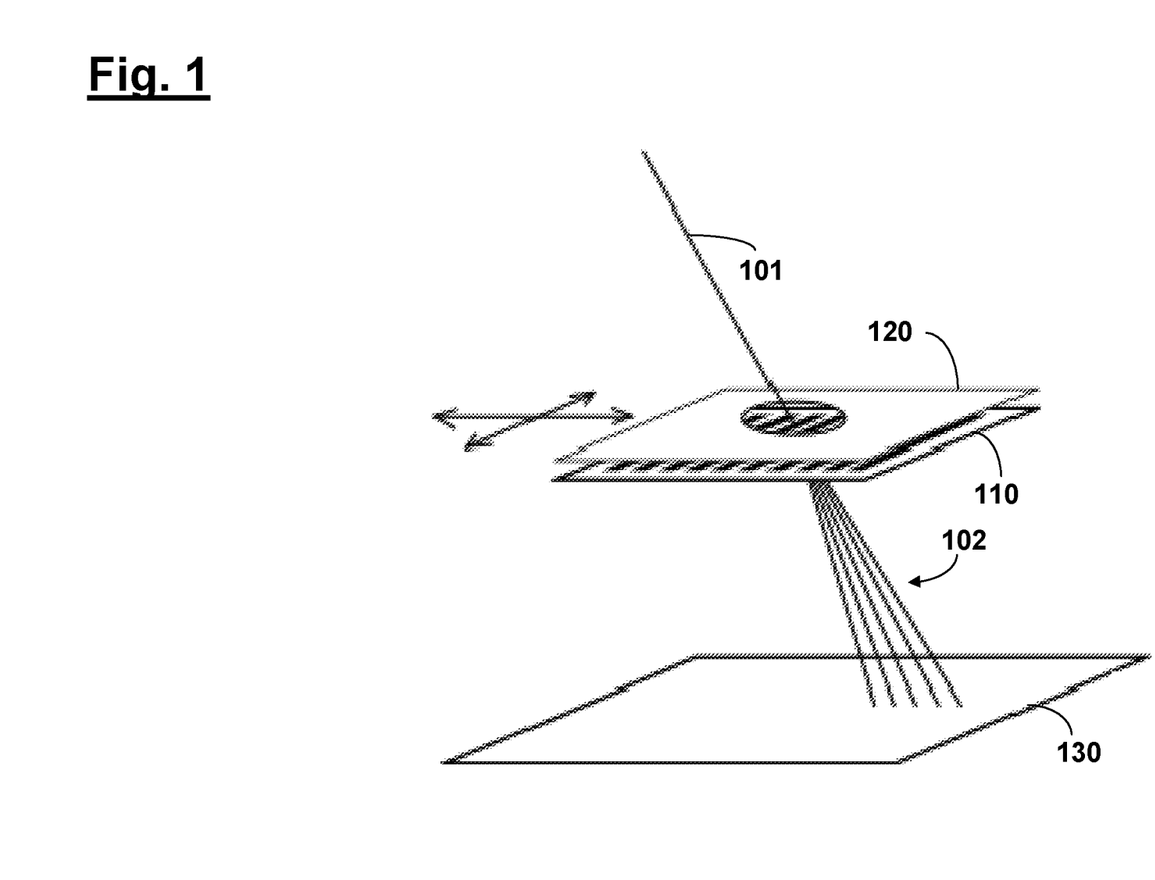
FIGS. 1-6 show schematic illustrations for explaining different embodiments of the present invention, an embodiment illustrating the overall principle of calibrating a diffractive measurement structure and including a displaceable stop (FIG. 1), an embodiment in which the measurement structure is arranged downstream of a test specimen (FIG. 2), an embodiment using a displaceable stop remote from the field (FIG. 3), an embodiment in which the diffractive measurement structure is configured to tilt (FIG. 4), an embodiment using plural illumination angles or angles of incidence (FIG. 5), and an embodiment using only partial regions of the measurement structure (FIG. 6)

To illustrate this principle, FIG. 1 initially shows a diffractive measurement structure 110 and an area-measuring, for example camera-based detector 130 (for example in the form of a CCD camera), via which a diffraction image generated by way of the diffractive structure 110 when it is illuminated with illumination light 101 can be recorded. "120" denotes a stop that is arranged displaceably with respect to the light path upstream of the diffractive structure 110 in the optical beam path. The region of the diffractive measurement structure that contributes to the respective diffraction image can be varied by displacing the stop 120 in a plane located transversely to the direction of light propagation or parallel to the diffractive measurement structure 110, as indicated by the depicted arrows, with the result that in each case different diffraction images can be recorded for different displacement positions of the field plane 120 and be used as a basis for a suitable reconstruction algorithm that is known per se for ascertaining a transfer function of the diffractive measurement structure 110.

According to the invention, an inspection of the diffractive measurement structure 110 from different directions as part of a tomography is now additionally realized in as far as the measurement sequence described above is carried out repeatedly for different angles of incidence of the illumination radiation 101 that is incident on the diffractive measurement structure 110. As a result, calibration of the diffractive measurement structure 110 is realized in this way taking into account the angle dependence of the transmission properties or the reflection properties of the measurement structure 110 (brought about, for example, by the 3-dimensional topography of the measurement structure).

In embodiments of the invention, the above-described recording sequences for recording a plurality of diffraction images can furthermore also be repeated for different polarization directions of the illumination radiation 101, as a result of which a generally given dependence of the transfer function of the diffractive structure 110 on the polarization direction of the incident electromagnetic radiation can additionally be taken into account.

The invention is not further restricted with regard to the concrete implementation of the above-described variation of the angle of incidence of the illumination radiation that is incident on the diffractive measurement structure to be calibrated. In embodiments, said angle of incidence variation can be realized using a mirror device having a plurality of (possibly independently adjustable) mirror elements, wherein, for example, respectively different ones of the mirror elements of this mirror arrangement can contribute to the illumination of the measurement structure for different recording sequences. If appropriate, such a mirror arrangement can also already be present in the actual measurement arrangement in which the diffractive measurement structure to be calibrated is to be used (and which can be, for example, an arrangement for measuring distortion or for determining wavefront aberrations), and be used for the angle of incidence variation.

Figure 2:
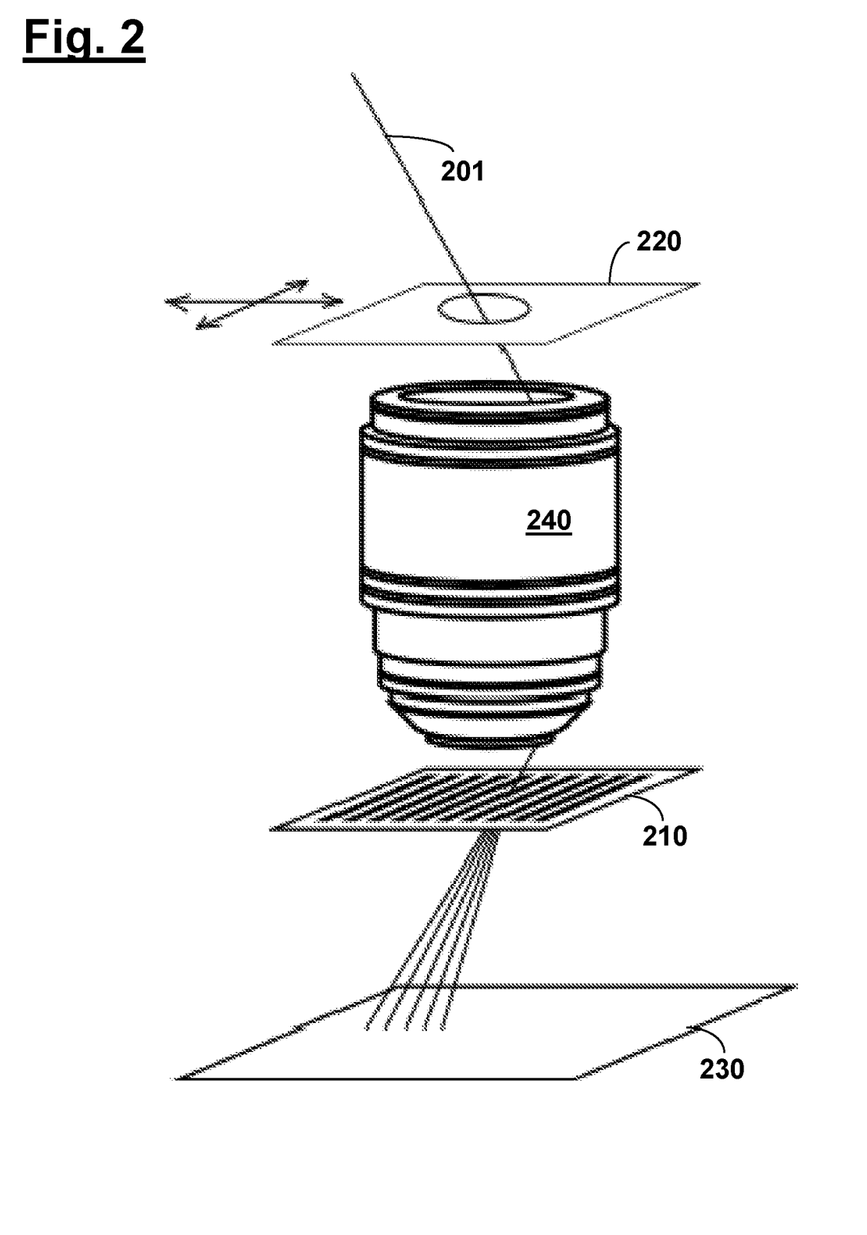
Figure 3:
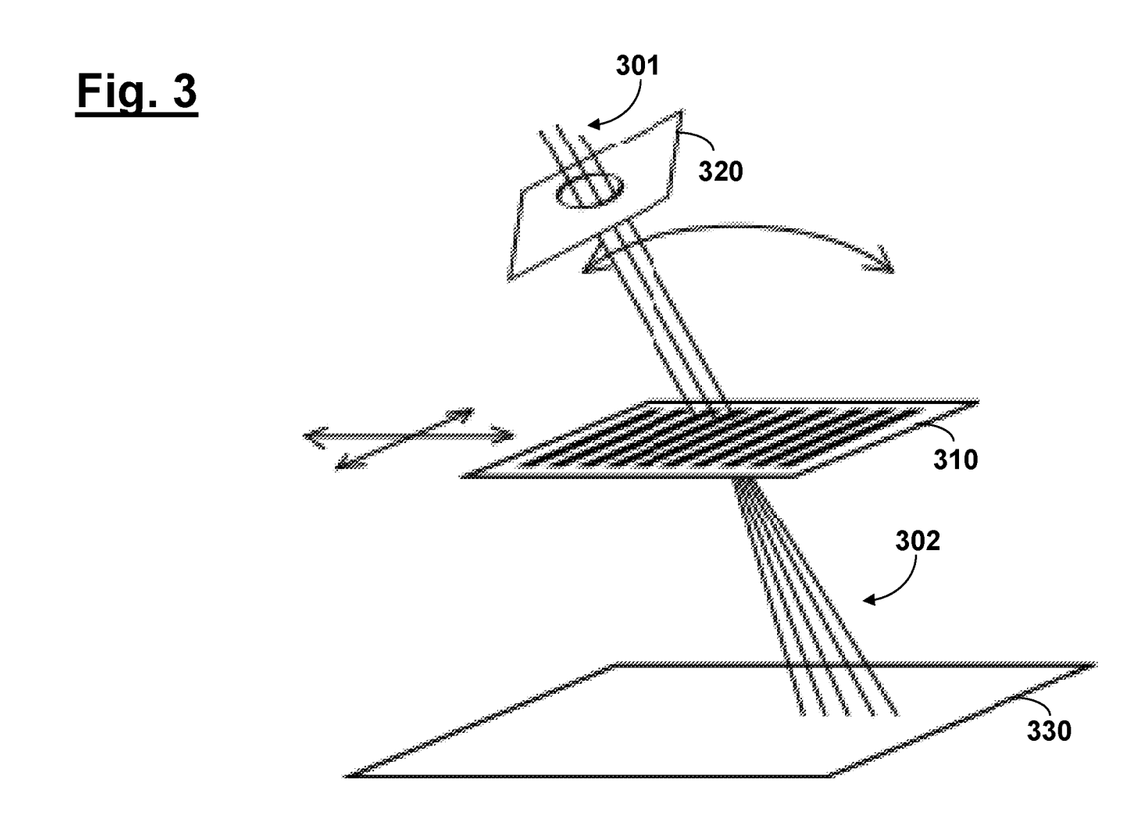

The diffractive measurement structure to be calibrated can furthermore, in particular, already be in the installed state of said measurement arrangement, as is shown merely schematically in FIG. 2. Here, components which are analogous or substantially functionally identical to FIG. 1 are denoted by reference numerals increased by "100". According to FIG. 2, the diffractive measuring structure 210 is already in the installed state, as described above, wherein it is arranged, in relation to the direction of light propagation, downstream of the test specimen 240 (e.g. projection lens) that is ultimately to be measured. This design has the advantage, among other things, that a separate measurement setup is unnecessary for the calibration, wherein effects due to the installation position (for example as a result of mechanical stresses) are also already detected by the calibration according to the invention when ascertaining the transfer function of the diffractive measurement structure 210. In addition, the calibration according to the invention can be repeated at any time after using the measurement arrangement (for example using one of the measurement concepts illustrated in FIGS. 8A-8C), without the need to remove the diffractive measurement structure from the measurement arrangement.

The stop used in the above-described embodiments for varying the region of the measurement structure that respectively contributes to the individual diffraction images can be arranged in a field plane or plane near the field. However, the invention is not limited to this, which means that arrangements in a plane remote from the field (outside a pupil plane) are also possible. This takes advantage of the fact that the projection of the relevant stop onto the diffractive measurement structure to be calibrated does not necessarily have to be sharply delimited in terms of the intensity profile but can also have a continuous intensity profile. The use of a stop remote from the field is illustrated merely schematically in FIG. 3, wherein components that are analogous or substantially functionally identical to FIG. 1 are denoted by reference numerals increased by "200".

Figure 4:
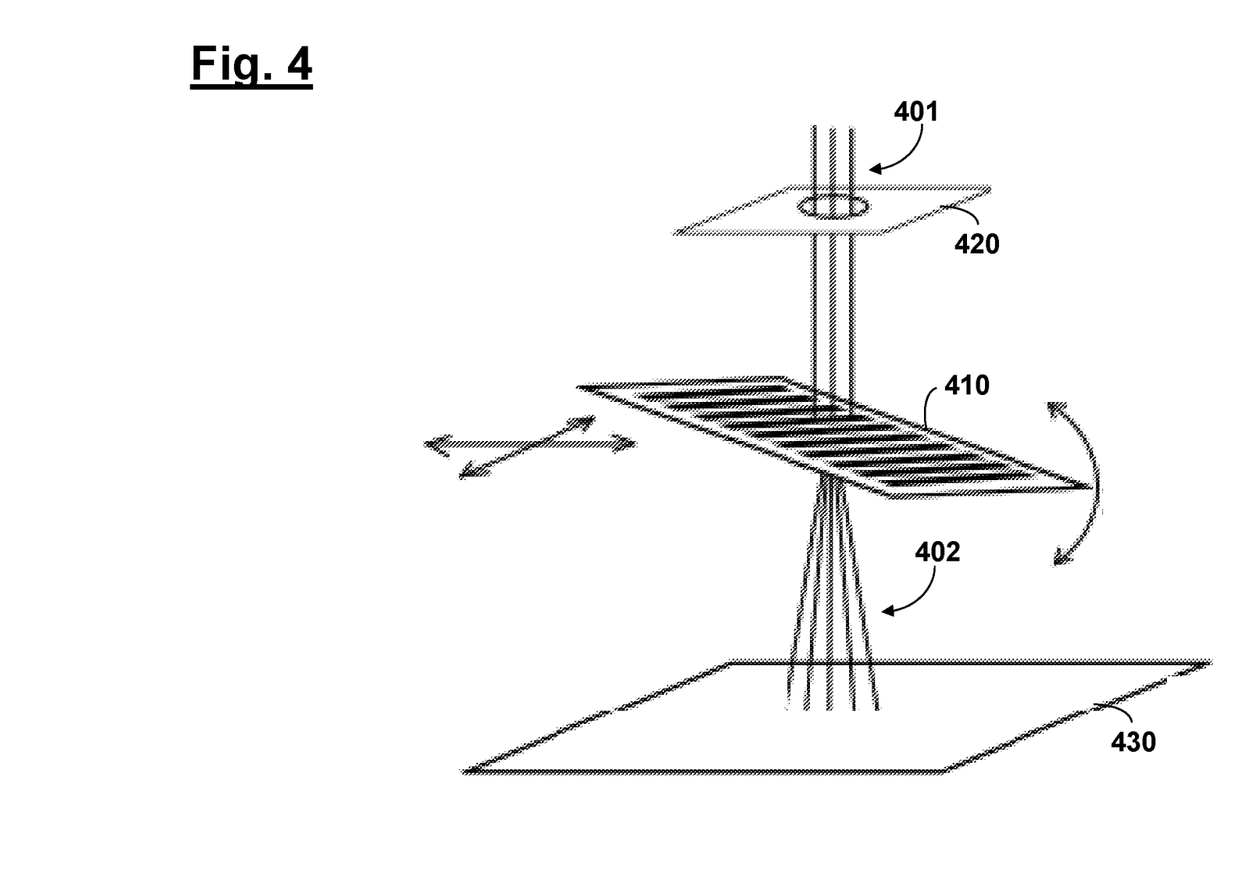

The variation according to the invention of the angles of incidence or illumination angles at which the illumination radiation is incident on the diffractive measurement structure to be calibrated can also be attained in embodiments by tilting the diffractive measurement structure, as is shown schematically in FIG. 4. Here, components which are analogous or functionally identical to FIG. 1 are again denoted by reference numerals increased by "300".

Figure 5:
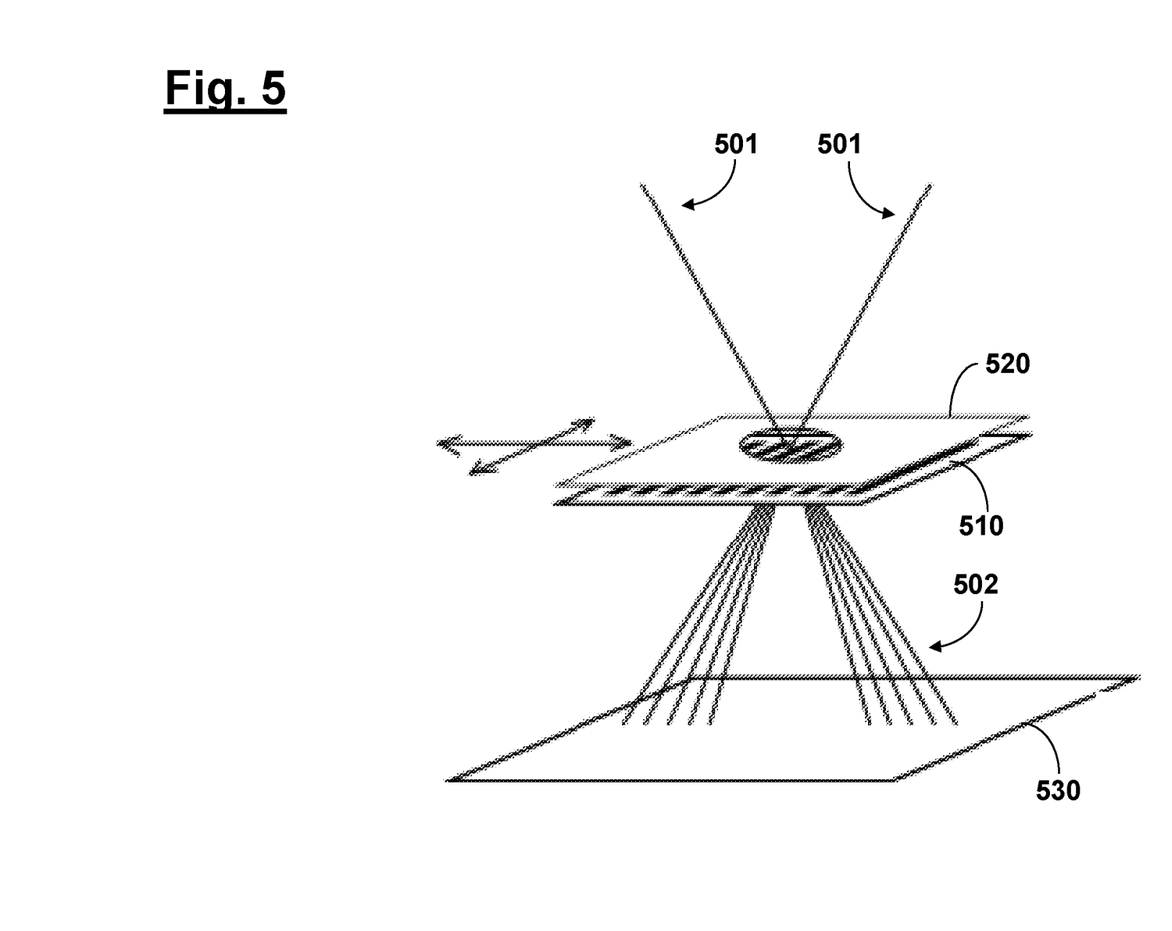

The performance of recording sequences according to the invention (corresponding to the recording of a plurality of diffraction images which differ from one another with regard to the respectively contributing region of the measurement structure to be calibrated) for different angles of incidence or illumination angles can also be effected in a manner such that the illumination light is already incident on the diffractive structure at more than one illumination angle or angle of incidence in one and the same measurement sequence. In this case, in particular the respective recording sequences can be performed (for example using a mirror arrangement already mentioned above having mirror elements that can be set independently of one another) with different illumination settings (for example dipole setting). FIG. 5 serves to illustrate such embodiments with illumination at in each case more than one illumination angle or angle of incidence, wherein components that are analogous or substantially functionally identical to FIG. 1 are again denoted by reference numerals increased by "400".

Figure 6:
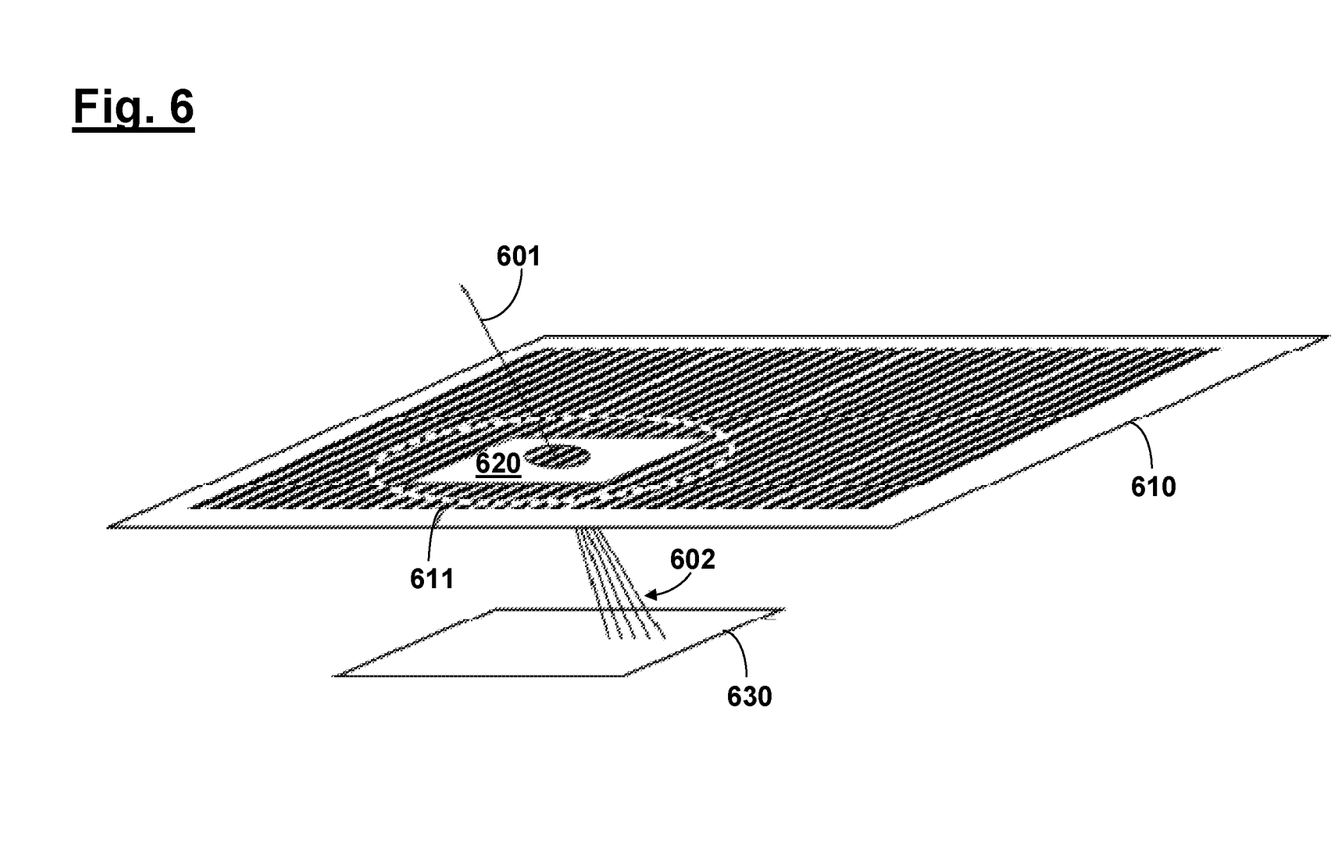

In particular when the calibration according to the invention is applied to a diffractive measurement structure or mask with comparatively large dimensions, the respective structure can also be measured sequentially, as indicated schematically in FIG. 6. Here, components which are analogous or substantially functionally identical to FIG. 1 are once more denoted by reference numerals increased by "500". As indicated in FIG. 6, the performance of the recording sequences with recording the respective diffraction images is effected here only on a partial region 611 of the diffractive measurement structure 610, wherein a corresponding iteration is performed over a plurality of such partial regions of the diffractive structure 610.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and equivalents thereof.

What is claimed is:

1. A method for calibrating a diffractive measurement structure with a plurality of regions, wherein the method comprises:
   a) installing the diffraction measurement structure in a measurement arrangement downstream from a test specimen to be measured by the diffraction measurement structure;
   b) recording, under illumination of the diffractive measurement structure in the measurement arrangement via an illumination device, a plurality of diffraction images which differ in the regions of the diffractive measurement structure that contribute to the respective diffraction images, wherein the illumination device has a mirror arrangement having a plurality of independently settable mirror elements;
   c) ascertaining transmission properties and/or reflection properties of the diffractive measurement structure based on the plurality of diffraction images; and
   d) repeating a sequence of said steps b) through c) in a plurality of subsequent sequences, wherein the sequences differ from one another with respect to illumination angles that are respectively set during the illumination of the diffractive measurement structure and at which the diffractive measurement structure is illuminated, and wherein the variations in the illumination angles are set by selecting different mirror elements of the mirror arrangement that contribute to the illumination of the diffractive measurement structure;
   wherein the transmission properties and/or the reflection properties of the diffractive measurement structure are ascertained using a reconstruction algorithm in which an electromagnetic field present downstream of the diffractive measurement structure in a light propagation direction is reconstructed in amplitude and phase by evaluating the plurality of diffraction images.

2. The method as claimed in claim 1, wherein the sequences comprise variations in the illumination angles that are respectively set during the illumination of the diffractive measurement structure by setting mutually differing illumination settings via the illumination device.

3. The method as claimed in claim 1, wherein said step b), in which the region of the diffractive measurement structure that contributes to the respective diffraction image is varied, comprises either displacing at least one stop in an optical beam path of the illumination or interchanging a given stop located in the optical beam path for at least one stop having a geometry different from the given stop.

4. The method as claimed in claim 1, wherein, in said step b), the regions of the diffractive measurement structure that contribute to the respective diffraction images vary such that respectively adjacent regions of the measurement structure that contribute to different diffraction images overlap one another.

5. The method as claimed in claim 1, wherein the diffractive measurement structure is a phase mask.

6. The method as claimed in claim 5, wherein the diffractive measurement structure is a computer-generated hologram (CGH).

7. The method as claimed in claim 1, wherein the diffractive measurement structure is a transmission mask configured for location-dependent attenuation of incident electromagnetic radiation.

8. The method as claimed in claim 1, wherein the measurement arrangement comprises an arrangement for wavefront or distortion measurement of an optical system or an arrangement for interferometric inspection of a surface of an optical element.

9. The method as claimed in claim 1, wherein said ascertaining comprises ascertaining a transfer function of the diffractive measurement structure based on the reconstruction.

10. An apparatus for calibrating a diffractive measurement structure configured to carry out the method as claimed in claim 1.

11. A microlithographic projection exposure apparatus, comprising an apparatus as claimed in claim 10.

12. The method as claimed in claim 1, wherein the test specimen comprises a projection lens.

13. The method as claimed in claim 1, wherein ascertaining the transmission properties and/or the reflection properties of the diffractive measurement structure based on the plurality of diffraction images comprises ascertaining effects of an installation position of the diffractive measurement structure within the measurement arrangement.

14. The method as claimed in claim 13, wherein ascertaining the effects of the installation position of the diffractive measurement structure within the measurement arrangement comprises ascertaining effects of mechanical stresses on the diffractive measurement structure.

* * * * *